(12) United States Patent
Clough et al.

(10) Patent No.: US 7,905,276 B2
(45) Date of Patent: Mar. 15, 2011

(54) METHOD AND APPARATUS FOR LEAK-PROOF MOUNTING OF A LIQUID COOLING DEVICE ON AN INTEGRATED CIRCUIT

(75) Inventors: William J. Clough, Alamo, CA (US); Franz M. Schuotte, Colorado Springs, CO (US)

(73) Assignee: Onscreen Technology, Inc., Portland, OR (US)

(*) Notice: Subject to any disclaimer, the term of this patent is extended or adjusted under 35 U.S.C. 154(b) by 1072 days.

(21) Appl. No.: 11/703,867

(22) Filed: Feb. 7, 2007

(65) Prior Publication Data
US 2007/0181555 A1  Aug. 9, 2007

Related U.S. Application Data

(60) Provisional application No. 60/771,429, filed on Feb. 9, 2006.

(51) Int. Cl.
*F28F 7/00* (2006.01)

(52) U.S. Cl. ........................ 165/80.4; 165/80.5; 361/702
(58) Field of Classification Search ................ 165/80.4, 165/80.5; 361/699, 702
See application file for complete search history.

(56) References Cited

U.S. PATENT DOCUMENTS

| | | | |
|---|---|---|---|
| 2,728,551 A | | 12/1955 | Blackman |
| 4,396,935 A | * | 8/1983 | Schuck .......................... 257/706 |
| 6,014,315 A | * | 1/2000 | McCullough et al. ........ 361/704 |
| 6,392,313 B1 | | 5/2002 | Epstein et al. |
| 6,549,407 B1 | * | 4/2003 | Sauciuc et al. ................ 361/699 |
| 6,695,042 B1 | * | 2/2004 | Boudreaux et al. ...... 165/104.33 |
| 6,992,888 B1 | * | 1/2006 | Iyer .............................. 361/699 |

* cited by examiner

*Primary Examiner* — Teresa J. Walberg
(74) *Attorney, Agent, or Firm* — William W. Haefliger

(57) ABSTRACT

Apparatus for cooling of an electrical circuit element on an electrical element package, comprising in combination, structure including a hollow body defining a cavity for containing cooling fluid located in heat transfer relation with said element, a rotatably tightenable connection between said package and said hollow body, and acting to block leakage of cooling fluid from said cavity.

7 Claims, 4 Drawing Sheets

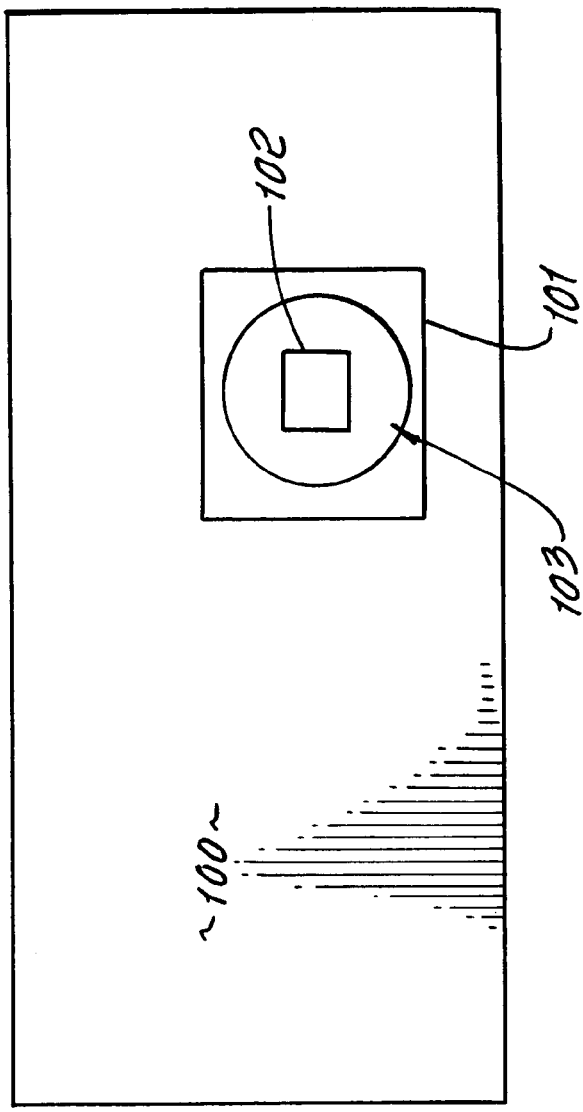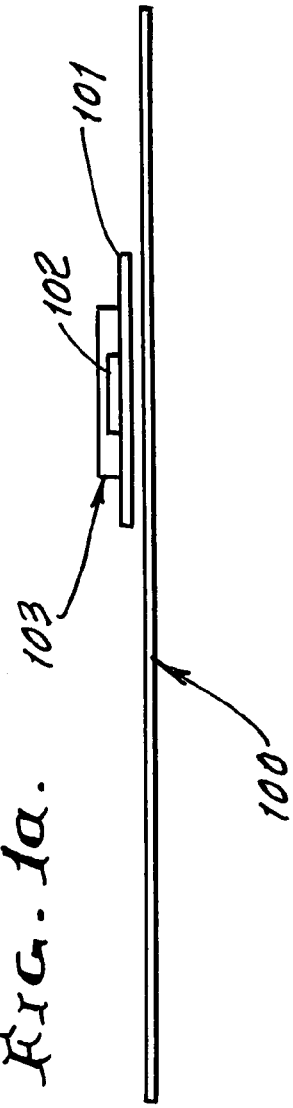

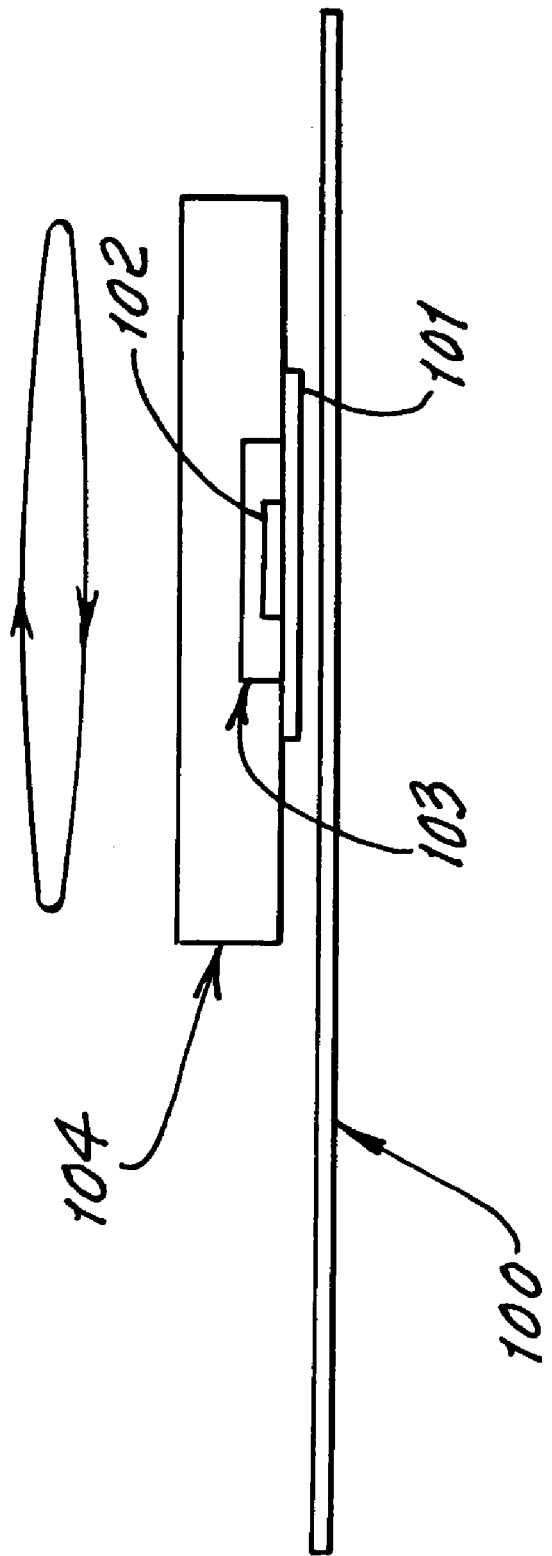

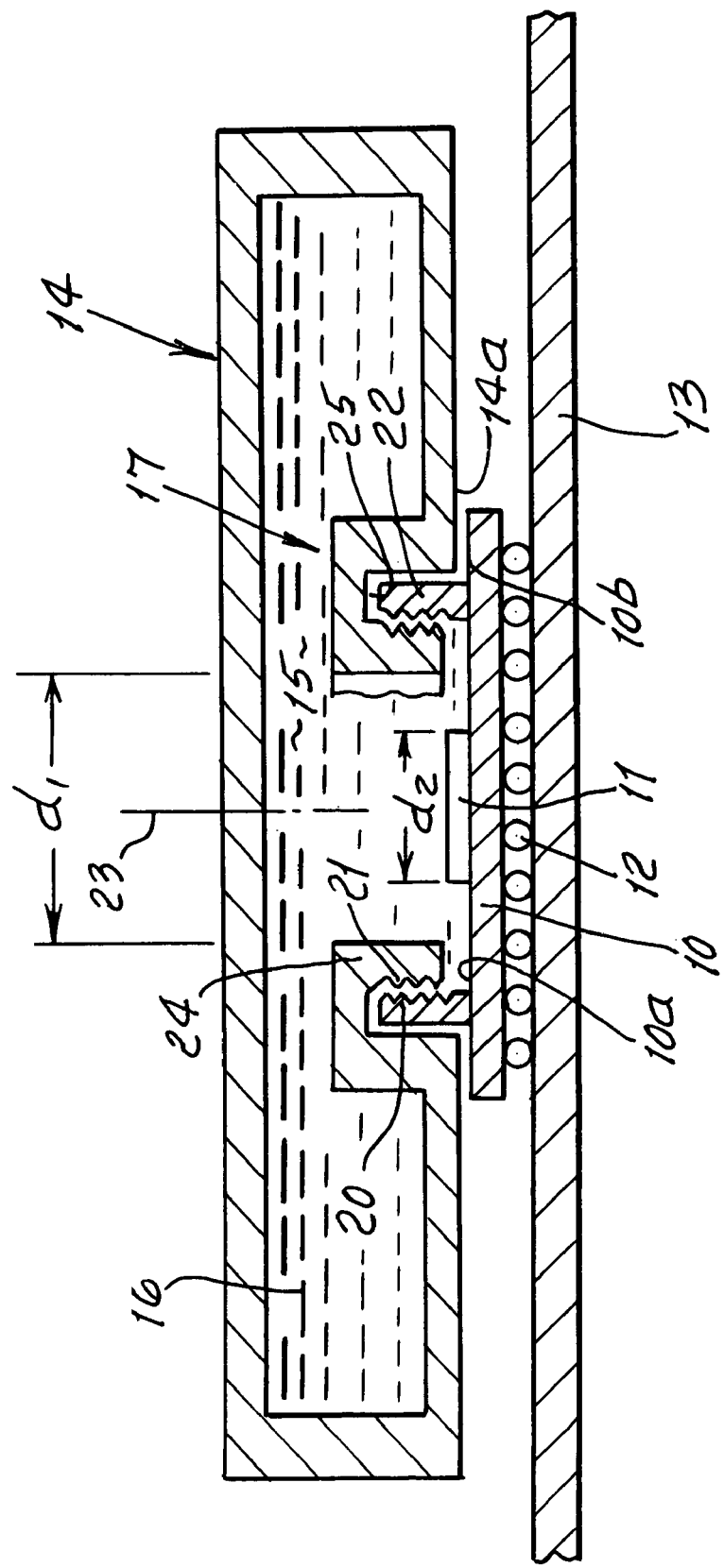

METHOD AND APPARATUS FOR LEAK-PROOF MOUNTING OF A LIQUID COOLING DEVICE ON AN INTEGRATED CIRCUIT

This application claims priority from provisional application Ser. No. 60/771,429, filed Feb. 9, 2006

This invention relates generally to heat dissipation from circuitry; and more particularly to sealing of connections between integrated circuit packages and hollow bodies containing coolant fluid.

BACKGROUND OF THE INVENTION

1. Field of the Invention

Contemporary computer systems are facing increasing difficulties with respect to thermal management. With the migration towards smaller processing geometry, higher clock speeds can be realized; at the same time, the transistor count of circuitry has grown exponentially. However, increasing clock speed and higher transistor counts translate into higher power consumption and, by extension, need for higher thermal dissipation.

In past years, performance-increasing design improvements have centered primarily on the central processing unit (CPU). As a side effect, also the thermal management efforts were primarily driven by the design and manufacture of CPUs. By comparison, other system components received relatively little attention. CPUs have one major drawback; they are extremely versatile but at the same time, because they have to handle so many different tasks, they perform relatively badly in specialized applications.

One case in point is the digestion of 3D graphics data. In short, any pixel output to the screen is essentially the product of 6 consecutive steps:
1. Application Tasks (the movement of objects according to tasks, movement of camera, aim of camera)
2. Scene Level Calculations (selection of detail level, object level culling, creating object mesh)
3. Transform
4. Lighting
5. Triangle Setup and Clipping
6. Rendering Until the end of 1999, Application Tasks, Scene Level Calculations, Transform and Lighting were performed by the CPU, however, the performance levels achieved could not keep up with the demands of the software. Starting in 1999, simple video processors began to evolve into graphics processing units that initially took over the tasks of transform and lighting but soon evolved further into visual processing units. The terms graphics processing units (GPUs) and visual processing units (VPUs) are generalized, but both have in common that the integrated circuit used is capable of processing vertices and textures in more complex ways than merely operating with geometry data and texturing the resulting triangles.

On the contrary, modern GPUs/VPUs are capable of parallel execution of highly sophisticated programs called shaders that turn relatively simple geometry models into independent entities, or else assign color-changing routines to the individual triangles on a per pixel basis. It is understood that any of these geometry and pixel permutations require logic operations, and each logic operation requires clock cycles, and therefore, electrical energy. By extension, this implies that increasingly complex graphics require increasing amounts of electrical power to be dissipated as heat.

One particular obstacle in the management of thermal dissipation on the level of GPUs is the form factor definition of current computer systems. The currently prevailing ATX specifications have strict definitions of the space allotted for CPU cooling and they also define the distance between expansion slots on the motherboard. For low and midrange graphics cards, the available space suffices; however, as soon as one moves towards the high-end graphics sector, it is evident that a single slot cooling solution no longer suffices.

A short comparison of the power consumption of CPUs and GPUs shows that the power consumption of both groups has reached parity:

| CPU Power Consumption Under Full Load* | |
|---|---|
| AMD Athlon64 (Venice - 2400 MHz) | 31 W (Watts) |
| AMD Athlon64 (San Diego - 2800 MHz) | 60 W |
| AMD Athlon64-X2 (Newcastle - 2000 MHz) | 48 W |
| AMD Athlon64-X2 (Toledo - 2600 MHz) | 81 W |
| Intel P4 670 | 121 W |
| Intel P4 820D | 115 W |
| Intel P4 840 XE | 147 W |
| Intel P4 955 XE | 144 W |

*http://www.lostcircuits.com/cpu/amd_fx60/6.shtml

| Graphics Card Power Consumption Under Full Load** | |
|---|---|
| ATI RADEON X800 GT | 40 W |
| ATI RADEON X1600 GT | 42 W |
| nVidia GeForce 6600 GT | 48 W |
| nVidia GeForce 7800 GT | 57 W |
| nVidia GeForce 7800 GTX | 80 W |
| ATI RADEON X1800 GT | 103 W |
| nVidia GeForce 7800 GTX-512 | 95 W |
| ATI RADEON X1900 XTX | 121 W |

**http://www.xbitlabs.com/articles/video/display/gpu-consumption2006.html\

Future graphics cards will have even higher power consumption, and expected values for the end of 2006 are around 180 W power consumption whereas it is expected that the power consumption of CPUs may stay at the present level or even decrease.

2. Description of Related Art

The increased power consumption of GPUs along with the restrictions of the available cooling space requires the consideration of alternative cooling is solutions. Of particular interest are solutions that actively move heat away from the source to a remote radiator that is not within the same thermal zone as the heat source. For example, currently used solutions use fans that blow hot air out of the case through ventilation slots in the mounting brackets using air pipes or tunnels. Other solutions use heatpipes. In advanced cases, water and thermoelectric cooling solutions are employed.

Even more important than the transport of heat out of the case or housing is the method of heat transfer between the heat source and the heat sink. Conventional heat transfer relies on transfer of heat from one surface to another using a thermal interface material (TIM). In general, this approach works, however, the actual removal of heat is limited by the thermal transfer rate of the heatsink, which is a matter of the thermal coefficient and the thickness of the material. Regardless of how advanced the design may be, this method of heat transfer relies on diffusion of heat through a solid body of material and is, therefore, slow.

A different approach uses fluids to transport the heat away from the source. Conventional waterblocks still rely on the same principle as that underlying air-cooling-based heatspreaders, that is, there is a passive heat diffusion from the IC to a thermal interface material and then to the heatspreader. In the latter, the heat still needs to diffuse from through a solid wall until it reaches waterchannels.

A different method of removing heat from a source is to bring the coolant into direct contact with the heat source, in this case the IC. In this regard, the laminar flow over the surface that needs to be cooled is the limiting factor for the heat transfer. There are different ways of optimizing the flow and the heat exchange, the most efficient method using a microcapillary system. A reasonable approximation of this approach can be achieved through the use of a micro-mesh that introduces turbulences in the flow as disclosed in U.S. patent application Ser. No. 11/314,433.

A problem with retrofitting a cooling system such as that described above is the inherent risk for spills and leaks. Spills can cause shorting of electrical contacts, likewise, leaks can cause overheating problems because of the resulting lack of fluid. Conventional mounting techniques use elastic O-rings but in a "mission-critical" application, this solution does not suffice. It is therefore understood that the implementation of a cooling solutions such as the one disclosed in U.S. patent application Ser. No. 11/314,433 requires mechanism that improves over those currently available.

SUMMARY OF THE INVENTION

The present invention provides an improved leak-proof mounting mechanism for a fluid cooling system where the fluid coolant is in direct contact with an IC surface, or a factory-mounted heat slug such as used by most CPU manufacturers. The invention can be used to mount a cooling device with a bottom opening onto any IC. The preferred embodiment of the invention provides an improved mounting mechanism useful with either CPUs or GPUs/VPUs but those skilled in the art will understand that the invention can be applied in a broader sense.

The simplest and most effective way of establishing a seal for the coolant is the use of a threaded seal. The invention enables permanent mounting of one threaded part on the package of the IC and the other threaded part mounted on the cooler. A compressible seal between the two parts employing Teflon or other durable materials, provides the necessary friction between the parts to make the seal spill proof. Alternatively, the seal can be mounted on the PCB (printed circuit board) of the device, surrounding the IC that needs to be cooled.

Further mechanical support of the cooling unit assures that there is no mechanical deformation of the assembly that could result in spills.

In short, the advantages of the current invention can be summarized as follows:

a) it provides a spill-proof seal,
b) it is mechanically stable and easy to implement on any surface using permanent mounting techniques,
c) a threaded female mount in combination with a male threaded insert allows the custom configuration and flow optimization of the cooling orifice eliminating concerns with seals in the immediate vicinity of the actual opening.

A major object of the invention is to provide apparatus for cooling of an electrical circuit element on an electrical element package, comprising in combination a) structure including a hollow body defining a cavity for containing cooling fluid located in heat transfer relation with said element, b) a rotatably tightenable connection between said package and said hollow body, and acting to block leakage of cooling fluid from said cavity.

Another object is to provide the tightenable connection to include interengaged first and second screw threads respectively on said package and on said hollow body. That connection may typically include an annular part projecting from said package and extending about said element, the first screw thread located on said part, and the second screw thread located on the hollow body. Also, the hollow body typically defines an opening via which the element is exposed to fluid in the cavity.

A further object is to provide an annular retainer integrally carried by the hollow body, and which extends re-entrantly into the cavity, the second screw thread located on the retainer. Such screw threads typically extend about an axis of an opening via which the element is exposed to fluid in the cavity, the first screw thread facing in one of the following directions:

i) toward said axis
ii) away from said axis.

Interengagable sealing shoulders are typically provided on that part and on the retainer.

Yet another object is to provide the electrical circuit element in the form of an integrated circuit intersected by a central axis defined by the retainers.

These and other objects and advantages of the invention, as well as the details of an illustrative embodiment, will be more fully understood from the following specification and drawings, in which:

BRIEF DESCRIPTION OF THE DRAWINGS

FIG. 1 diagrammatically shows a top view of a printed circuit board with an integrated circuit mounted;

FIG. 2 is a side view of the FIG. 1 apparatus;

FIG. 2 diagrammatically shows the circuit board of FIG. 1 with a cooling device mounted over the IC.

FIGS. 3 and 4 are elevation showing details of construction of preferred apparatus employing the invention.

DETAILED DESCRIPTION

Figure 9:
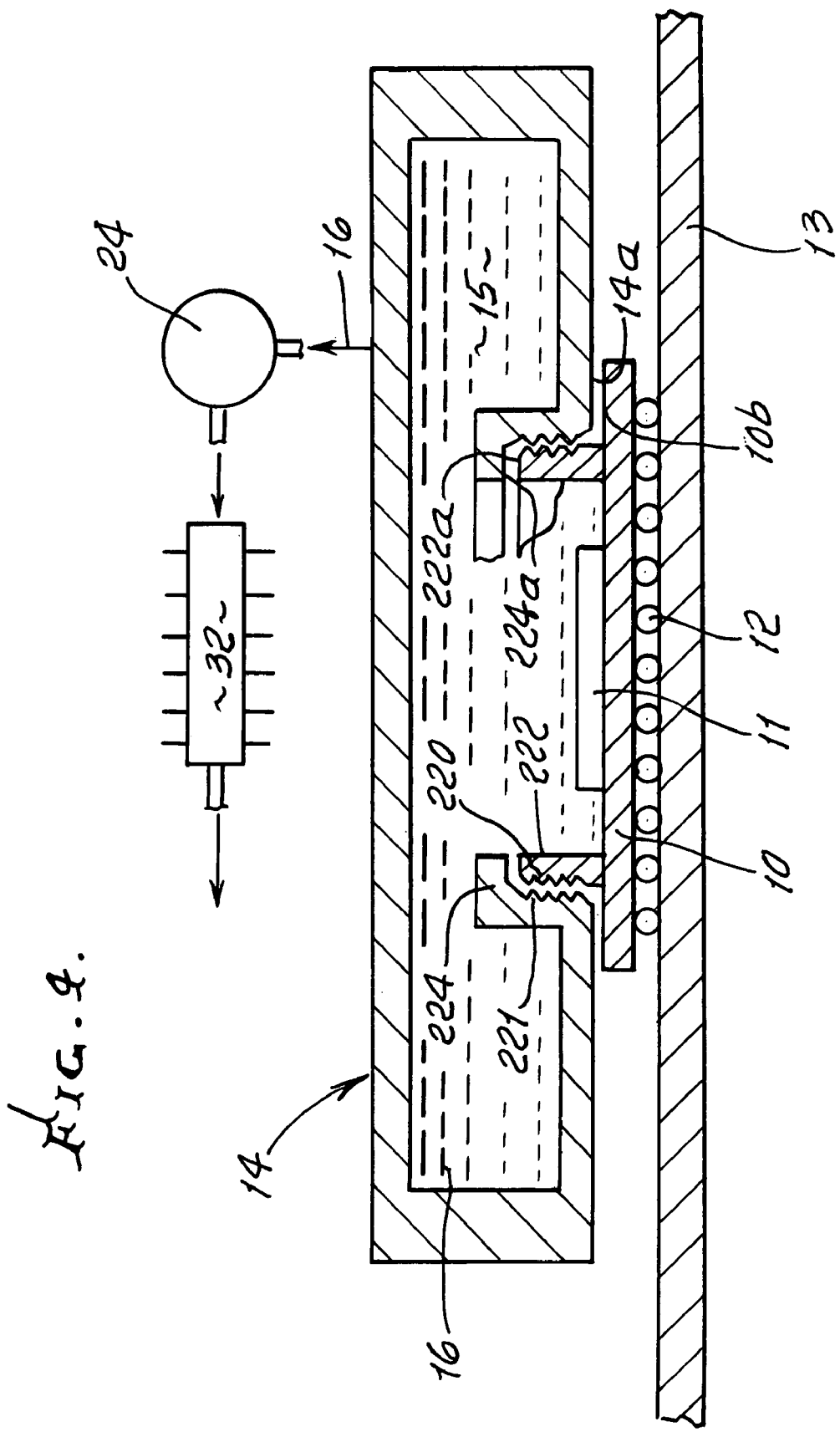

In FIGS. 1 and 1a, a printed circuit board carries or mounts a IC package 101, with an IC die, itself shown at 102. Numeral 103 designates an annular threaded mount for the cooling device to be screwed into place.

FIG. 2 shows the circuit board 100, with the cooling device 104 screwed into place onto 103, to project over die 102.

FIG. 3 is an enlarged view, taken in section, to show details of one form of the invention. An electrical element 11 as for example an integrated circuit device, is located at the upper side of electrical element package 10. Element 11 may be considered as part of the package, which is carried, as via bonding balls 12, or connectors, on a printed circuit board 13, to be in electrical communication with circuitry on the board.

Also shown is structure including a hollow body or ring mount 14 defining a cavity 15 for containing cooling fluid 16. That fluid will be understood as located in heat transfer relation with element 11. As shown, element 11 is in surface contact with the fluid 16.

A rotatably tightenable connection 17 is provided between the package 10 and the hollow body 14, to act as a means or part thereof for blocking leakage of cooling fluid from the cavity 15. Connection 17 includes first and second interengaged screw threads 20 and 21 respectively on the package 10 and on the hollow body 14. See for example first thread 20 carried on the package 10, and second thread 21 carried on body 14. The example in FIG. 3 shows an annular part 22 on and projecting upwardly from the package upper surface 10*a* to provide first thread 20 facing radially inwardly toward thread axis 23; and annular retainer 24 integral with body 14, to carry second thread 21 facing radially outwardly from the axis 23 common to both threads. Retainer 24 extends re-entrantly into the cavity 15, and forms an annular downwardly opening recess 25 receiving part 22. This enables the lower side 14*a* of body 14 to extend close to the upper side 10*b* of package 10, providing a very compact overall assembly. Also, the sides 10*a* and 10*b* may come into contact, upon rotary tightening of the connection, providing a surface to surface annular seal enhancing the leakage blocking relationship. The interengagement of the threads, as described, for example interfering also provides substantial, or complete, coolant fluid leakage blockage, and the threads may consist of seal material as referred to above. thread 221 on re-entrant annular retainer 224 faces radially inwardly. Cavity 15 extends annularly about the re-entrant retainer to enhance coolant fluid volume receiving heat from element 11. Shoulders 222*a* on 222 and 224*a* on 224 may interengage to provide fluid sealing.

A pump 24 is typically provided to circulate fluid 16 from and back to cavity 15. Also, a heat transfer device 32 may be provided to remove heat from the circulated fluid.

I claim:

1. Apparatus for cooling of an electrical circuit element on an electrical element package, comprising in combination with said electrical element package and electrical circuit element:
   a) structure including a hollow body defining a cavity for containing cooling fluid located in direct heat transfer relation and contact with said electrical circuit element,
   b) a rotatably tightenable connection between said electrical element package and said hollow body, and acting to block leakage of cooling fluid from said cavity,
   c) said connection including interengaged first and second sealing screw threads respectively on said electrical element package and on said hollow body, and exposed to fluid in said cavity,
   d) said connection including an annular part projecting from said electrical element package and extending about said electrical circuit element, said first screw thread located on said part, and said second screw thread located on a portion of said hollow body that projects re-entrantly into said hollow body,
   e) said hollow body defining an opening via which said electrical circuit element is directly exposed to fluid in said cavity, said screw threads extending about said opening, said opening extending re-entrantly into the interior of said hollow body.

2. The combination of claim 1 wherein said part defines an annular retainer integrally carried by said hollow body, and which extends re-entrantly into said cavity, said second screw thread located on said retainer.

3. The combination of claim 2 wherein the screw threads extend about said axis of an opening via which said element is exposed to fluid in the cavity, said first screw thread facing in one of the following directions:
   i) toward said axis
   ii) away from said axis.

4. The combination of claim 1 wherein said element is an integrated circuit.

5. The combination of claim 2 including interengaged sealing shoulders on said part and said retainer.

6. The combination of claim 4 wherein said part and retainer have a central axis, which intersects said integrated circuit.

7. The combination of claim 1 wherein the screw threads extend about a cavity receiving said element and into which cooling fluid extends from a larger body of cooling fluid, said larger body of cooling fluid extending annularly about said screw threads.

* * * * *

UNITED STATES PATENT AND TRADEMARK OFFICE
CERTIFICATE OF CORRECTION

PATENT NO. : 7,905,276 B2  Page 1 of 1
APPLICATION NO. : 11/703867
DATED : March 15, 2011
INVENTOR(S) : William J. Clough and Franz M. Schuette It is certified that error appears in the above-identified patent and that said Letters Patent is hereby corrected as shown below:

On the title page, item (75) Inventors: should read:

--William J. Clough, Alamo, CA (US);
 Franz M. Schuette, Colorado Springs, CO (US)--

Signed and Sealed this
Thirteenth Day of September, 2011

David J. Kappos
*Director of the United States Patent and Trademark Office*